United States Patent
Issaq et al.

(10) Patent No.: US 7,393,722 B1
(45) Date of Patent: Jul. 1, 2008

(54) REPROGRAMMABLE METAL-TO-METAL ANTIFUSE EMPLOYING CARBON-CONTAINING ANTIFUSE MATERIAL

(75) Inventors: A. Farid Issaq, Campbell, CA (US); Frank Hawley, Campbell, CA (US); John McCollum, Saratoga, CA (US)

(73) Assignee: Actel Corporation, Mountain View, CA (US)

( * ) Notice: Subject to any disclaimer, the term of this patent is extended or adjusted under 35 U.S.C. 154(b) by 359 days.

(21) Appl. No.: 11/195,002

(22) Filed: Aug. 1, 2005

Related U.S. Application Data

(60) Division of application No. 10/784,903, filed on Feb. 20, 2004, which is a continuation-in-part of application No. 10/331,144, filed on Dec. 27, 2002, now Pat. No. 6,965,156, and a continuation-in-part of application No. 09/972,825, filed on Oct. 2, 2001.

(51) Int. Cl.
 *H01L 21/82* (2006.01)
(52) U.S. Cl. .............. 438/131; 438/600; 438/637; 438/643; 438/675
(58) Field of Classification Search ............ 438/105, 438/131, 467, 600, 627, 637, 643, 653, 675, 438/700, 931, 957
See application file for complete search history.

(56) References Cited

U.S. PATENT DOCUMENTS

| | | | |
|---|---|---|---|
| 4,442,507 A | 4/1984 | Roesner | |
| 4,543,594 A | 9/1985 | Mohsen et al. | |
| 4,599,705 A | 7/1986 | Holmberg et al. | |
| 4,823,181 A | 4/1989 | Mohsen et al. | |
| 4,881,114 A | 11/1989 | Mohsen et al. | |
| 4,899,205 A | 2/1990 | Hamdy et al. | |
| 5,008,855 A | 4/1991 | Eltoukhy et al. | |
| 5,070,384 A | 12/1991 | McCollum et al. | |
| 5,126,282 A | 6/1992 | Chiang et al. | |
| 5,171,715 A | 12/1992 | Husher et al. | |
| 5,181,096 A | 1/1993 | Forouhi | 257/530 |
| 5,196,724 A | 3/1993 | Gordon et al. | |

(Continued)

FOREIGN PATENT DOCUMENTS

EP 1461824 A2 9/2004

(Continued)

OTHER PUBLICATIONS

Li, S. et al., "A New Metal-to-Metal Antifuse with Amorphous Carbon", IEEE Electron Device Letters, vol. 19, No. 9, pp. 317-319, Sep. 1998.

(Continued)

*Primary Examiner*—Ori Nadav
(74) *Attorney, Agent, or Firm*—Sierra Patent Group, Ltd.

(57) ABSTRACT

A reprogrammable metal-to-metal antifuse is disposed between two metal interconnect layers in an integrated circuit. A lower barrier layer is formed from Ti. A lower adhesion-promoting layer is disposed over the lower Ti barrier layer. An antifuse material layer selected from a group comprising at least one of amorphous carbon and amorphous carbon doped with at least one of hydrogen and fluorine is disposed over the lower adhesion-promoting layer. An upper adhesion-promoting layer is disposed over the antifuse material layer. An upper Ti barrier layer is disposed over the upper adhesion-promoting layer.

5 Claims, 6 Drawing Sheets

U.S. PATENT DOCUMENTS

| | | |
|---|---|---|
| 5,272,101 A | 12/1993 | Forouhi et al. |
| 5,308,795 A | 5/1994 | Hawley et al. |
| 5,365,104 A | 11/1994 | Godinho et al. |
| 5,411,917 A | 5/1995 | Forouhi et al. |
| 5,550,400 A | 8/1996 | Takagi et al. |
| 5,576,576 A | 11/1996 | Hawley et al. |
| 5,592,016 A | 1/1997 | Go et al. |
| 5,763,898 A | 6/1998 | Forouhi et al. |
| 5,780,323 A | 7/1998 | Forouhi et al. |
| 5,789,764 A | 8/1998 | McCollum .................. 257/76 |
| 5,807,786 A | 9/1998 | Chang |
| 5,965,270 A | 10/1999 | Fang et al. |
| 6,107,165 A | 8/2000 | Jain et al. |
| 6,114,714 A | 9/2000 | Gangopadhyay |
| 6,124,193 A | 9/2000 | Hawley et al. |
| 6,130,572 A | 10/2000 | Ghilardelli et al. |
| 6,259,130 B1 | 7/2001 | Wu |
| 6,316,346 B1 | 11/2001 | Gangopadhyay |
| 6,437,365 B1 | 8/2002 | Hawley et al. |
| 6,529,038 B2 | 3/2003 | Lambertson |
| 6,583,953 B1 | 6/2003 | Han et al. .................. 360/122 |
| 6,630,396 B2 | 10/2003 | Yang et al. |
| 6,674,667 B2 | 1/2004 | Forbes |
| 6,728,126 B1 | 4/2004 | Issaq et al. |
| 6,767,769 B2 | 7/2004 | Hawley et al. |
| 6,906,421 B1 | 6/2005 | Shan et al. |
| 6,965,156 B1 | 11/2005 | Hawley et al. |
| 2002/0100907 A1 | 8/2002 | Wang |
| 2003/0062596 A1 | 4/2003 | Hawley et al. |
| 2003/0205723 A1 | 11/2003 | Hawley et al. |

FOREIGN PATENT DOCUMENTS

| | | |
|---|---|---|
| EP | 1721338 A2 | 11/2006 |
| GB | 1305454 A | 1/1973 |
| WO | 2003030217 A2 | 4/2003 |
| WO | 2003030217 A3 | 7/2003 |
| WO | 2005081976 A3 | 9/2005 |

OTHER PUBLICATIONS

Co-pending U.S. Appl. No. 10/784,903 filed Feb. 20, 2004 entitled Reprogrammable Metal-To-Metal Antifuse Employing Carbon-Containing Antifuse Material.

Co-pending U.S. Appl. No. 11/078,952 filed Mar. 10, 2005 entitled Switching Ration and On-State Resistance on an Antifuse Programmed Below 5mA and Having a Ta or TaN Barrier Metal Layer.

Co-pending U.S. Appl. No. 11/210,492 filed Aug. 23, 2005 entitled Amorphous Carbon Metal-To-Metal antifuse With Adhesion Promoting Layers.

European Supplementary Search Report issued Dec. 4, 2006 in European Patent Application No. 027776069.3, based on International Patent Application No. PCT/US02/31253 of co-pending U.S. Appl. No. 09/972,825.

REPROGRAMMABLE METAL-TO-METAL ANTIFUSE EMPLOYING CARBON-CONTAINING ANTIFUSE MATERIAL

RELATED APPLICATIONS

This application is a divisional of co-pending U.S. patent application Ser. No. 10/784,903, filed Feb. 20, 2004, which is a continuation-in-part of co-pending U.S. patent application Ser. No. 09/972,825, filed Oct. 2, 2001 and U.S. patent application Ser. No. 10/331,144, filed Dec. 27, 2002 now U.S. Pat. No. 6,965,156, assigned to the same assignee as the present invention, which are hereby incorporated by reference as if set forth herein.

BACKGROUND

1. Field of the Invention

The present invention relates to amorphous carbon metal-to-metal antifuse structures. More particularly, the present invention relates to reprogrammable amorphous carbon metal-to-metal antifuse structures employing adhesion layers and titanium (Ti) barrier layers.

2. The Background Art

Integrated electronic circuits are typically fabricated with all internal connections set during the manufacturing process. However, because of high development costs and high manufacturing tooling costs of such circuits, it is advantageous for integrated circuits to be configured or programmed by the user to implement a desired application. Such circuits are called programmable circuits, and antifuses are known in the art for providing the programmability of these circuits. Antifuses are devices that generally comprise a pair of conductive electrodes sandwiched about an insulating antifuse material layer.

A programming process disrupts the antifuse material and forms a filament between the two electrodes. Prior to programming, antifuses exhibit a resistance as high as a few gigaohms between the two electrodes and may be considered to be open circuits. The programming process creates a low-impedance connection of a few ohms to a few thousand ohms between the two electrodes. Programming voltages range from a few volts to about 20 volts.

It is known in the art that antifuses have been fabricated where the electrodes have been selected from a number of different electrically conductive layer materials, and the antifuse material layer has been fabricated from a number of different insulating materials. It is also known that many different antifuse structures have been proposed, including, "via" type, half-stacks, full stacks, conductive plugs and numerous other variations.

Antifuses are generally classified into two categories. A first type of antifuse, referred to as a substrate antifuse, has a doped region in a semiconductor substrate as its lower electrode and a layer of metal or doped polysilicon as its upper electrode. The antifuse material typically comprises one or more layers of silicon nitride or silicon dioxide. An example of such an antifuse is made of an oxide-nitride-oxide (ONO) antifuse material layer sandwiched between an N+ diffusion layer and a polysilicon ("Poly") layer (N+/ONO/Poly). Such a device is described in detail in U.S. Pat. Nos. 4,823,181 and 4,881,114. For this category of antifuse, contacts have to be made to the N+ diffusion layer and the upper electrode from two corresponding conductive metal lines.

There are known problems with substrate-level antifuses. Some of the suggested dielectric materials require complex manufacturing techniques and have low reliability during programming. Some programmed antifuses may have a finite resistance on the order of several hundred to several thousand ohms which may render them relatively unsuitable for use in high speed circuits, and also result in high power consumption when a large number of circuits are switching simultaneously. Further, to maintain reliable operation at commercially acceptable voltages, proposed antifuse material layers are typically thin enough to produce a relatively high capacitance. This can place a limit on device operating speed because antifuses on a single line act as capacitors linked in parallel, such that the sum of the individual capacitances of the unprogrammed antifuses can slow data signals undesirably. Finally, substrate antifuses consume a lot of chip area.

A second type of antifuse, referred to as a metal-to-metal antifuse has a first metal layer disposed above and insulated from a semiconductor substrate as its lower electrode, a second metal layer as its upper electrode, and an antifuse material layer sandwiched between the first and second layers of metal. The antifuse material layer may be accompanied by one or more barrier metal layers separating it from lower and upper metal interconnect layers. Numerous structures for metal-to-metal antifuses are known in the art. Illustrative and non-exhaustive examples of metal-to-metal antifuses are shown in U.S. Pat. No. 5,272,101 to Forouhi et al.

The resistance of a programmed metal-to-metal antifuse is typically much lower than a programmed substrate level antifuse. During programming of a metal-to-metal antifuse, the metallization layers in the vicinity of the antifuse, the antifuse material layer and a portion of the adjacent metallization layers will disrupt and/or melt, and a conductive link will form through the antifuse material layer due to metal from the adjacent metallization layer being drawn in and intermixed through mass transport and thermal driven material diffusion and chemical reaction which is specific for an a-Silicon metal-to-metal antifuse.

Metal-to-metal antifuses usually employ a layer of amorphous silicon as the antifuse material, however, they may also employ oxide and nitride layers either alone or in multilayer combinations, or in combinations with amorphous silicon. Examples of antifuses that have been suggested using one or more oxide or nitride layers as antifuse material layers include U.S. Pat. No. 4,543,594 to Mohsen et al., U.S. Pat. No. 4,823,181 to Mohsen et al., U.S. Pat. No. 4,899,205 to Hamdy et al. Examples of antifuses that have been suggested using amorphous silicon as an antifuse material layer, either by itself, or in combination with one or more oxide or nitride layers include U.S. Pat. No. 5,070,384 to McCollum et al., U.S. Pat. No. 5,171,715 to Husher et al., and U.S. Pat. No. 5,181,096 to Forouhi et al., U.S. Pat. No. 5,272,101 to Forouhi et al., and U.S. Pat. No. 5,196,724 to Gordon.

Antifuse capacitance, as described above, is also a problem for metal-to-metal antifuses. Amorphous silicon antifuses alleviate this problem by providing a relatively thick antifuse layer, however, amorphous silicon antifuses exhibit relatively high leakage currents. Another approach has been to form a leakage barrier between the electrodes and the amorphous silicon antifuse material. A thin layer of deposited silicon dioxide or silicon nitride has been used. If this layer is too thin, it will not be an effective barrier, and if it is too thick, it will appreciably raise the programming voltage of the antifuse.

It is known that a-Silicon metal-to-metal antifuses will exhibit, under specific conditions where excessive current is placed across a programmed antifuse, a phenomenon wherein the conductive links will open up or become non-conductive. This failure mode is commonly known as "read disturb" because an excessive parasitic current occurs during the read state of the antifuse.

One factor that contributes to read disturb is the presence of any significant quantity of aluminum in the antifuse conductive links due to electromigration of the aluminum. Metal Barrier layers which serve to block aluminum flow into the antifuse material layer of various materials and various thicknesses have been proposed. The barrier materials, between the aluminum and the amorphous silicon, provide essentially all of the conductive material forming the conductive filament in the programmed antifuse. An antifuse formed with such a barrier metal link material can tolerate more current and have a higher reliability than an antifuse formed without the barrier metal link material.

Another way to overcome this problem is to change the composition of the antifuse material. For example, an amorphous silicon antifuse layer may be replaced with another low-temperature dielectric, such as oxide, nitride, or combinations of oxide and nitride have lower leakage current and higher breakdown voltage. Therefore, to maintain the same breakdown voltage requirements, the thickness of the antifuse dielectric has to be reduced. However, reducing the thickness of the antifuse material layer results in an increase in the capacitance of the antifuse in its unprogrammed state. This increased capacitance has a negative impact on the product speed.

Other materials which are harder and denser than amorphous silicon, such as silicon carbide (SiC) and amorphous carbon have been proposed to replace amorphous silicon to reduce the read disturb phenomenon and other problems associated with amorphous silicon metal-to-metal antifuses. It is important to employ these materials at desired programming voltages, and with a minimum of capacitance.

Amorphous carbon has been shown to significantly address the read disturb phenomenon. One problem in employing amorphous carbon as the antifuse material layer has been that it can fail to adhere to a metal electrode. Adhesion of the layers in a thin film device typically occurs because there is either ionic bonding at the interface of the films, metallurgical bonding where a chemical reaction between the materials results in a new material, or mechanical adhesion where the adhesion is due to the deposited film hooking onto surface nooks and projections.

When materials in a thin film device do not adhere to one another, a "glue" layer must be employed. In an amorphous-carbon based antifuse device, the problem of finding a glue layer material is difficult because a suitable glue layer material must adhere to both the metal electrode and the amorphous-carbon antifuse material layer. Concurrently, the adhesion material of the glue layer employed should have minimal impact on the programming and capacitance characteristics of the antifuse.

One other characteristic that is common to prior-art antifuses is that they have typically been only one-time programmable, that is that the programming mechanism that creates the low-resistance connection between the two antifuse electrodes has been irreversible. Once the antifuse has been programmed it becomes a permanent low-resistance connection. Controllable reprogramming of antifuses has been an elusive goal.

SUMMARY

A reprogrammable metal-to-metal antifuse is disposed between two metal interconnect layers in an integrated circuit. A lower barrier layer is formed from Ti. A lower adhesion-promoting layer is disposed over the lower Ti barrier layer. An antifuse material layer selected from a group comprising at least one of amorphous carbon and amorphous carbon doped with at least one of hydrogen and fluorine is disposed over the lower adhesion-promoting layer. An upper adhesion-promoting layer is disposed over the antifuse material layer. An upper Ti barrier layer is disposed over the upper adhesion-promoting layer.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
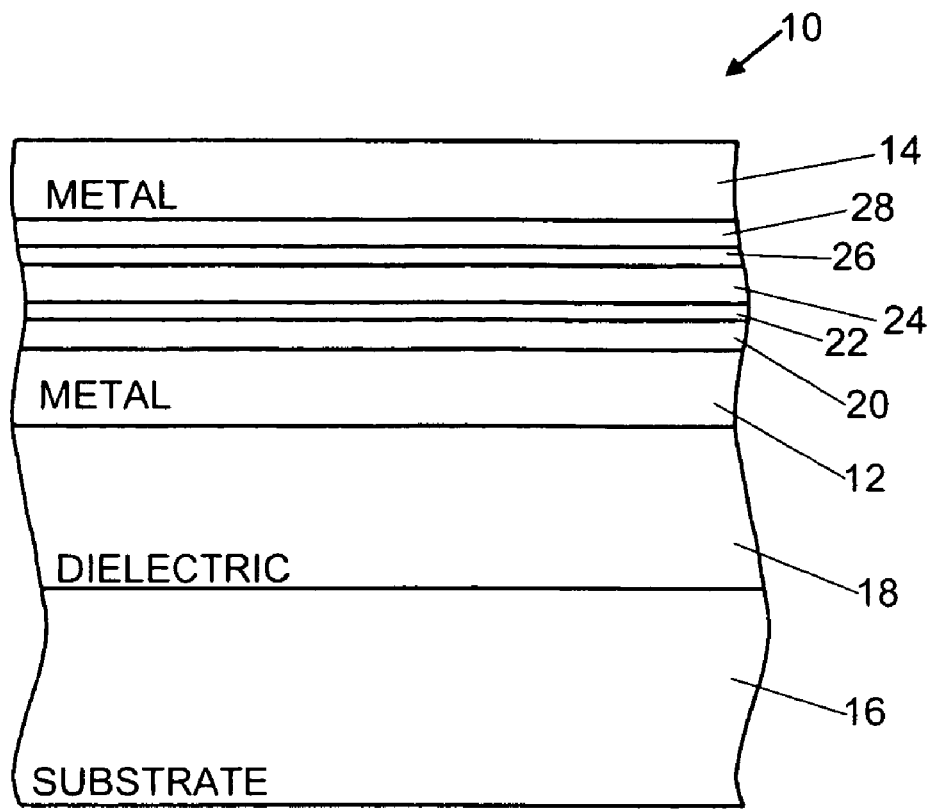
FIG. 1 illustrates schematically in a cross-sectional view a reprogrammable metal-to-metal antifuse according to the present invention.

In FIG. 1, a reprogrammable antifuse 10 according to the present invention is depicted generally in a cross-sectional view. The reprogrammable antifuse 10 is disposed between a lower metal interconnect layer 12 and an upper metal interconnect layer 14. Lower metal interconnect layer 12 and upper metal interconnect layer 14 are disposed above a semiconductor substrate 16 and an intervening insulating layer 18. The antifuse 10 has a lower Ti barrier layer 20, a lower adhesion-promoting layer 22 comprised of a material selected from the group comprising $Si_xC_y$ and $Si_xN_y$, an antifuse material layer 24 formed from amorphous carbon or amorphous carbon doped with at least one of hydrogen and fluorine, an upper adhesion-promoting layer 26 comprised of a material selected from the group comprising $Si_xC_y$ and $Si_xN_y$, and an upper Ti barrier layer 28. The lower and upper adhesion-promoting layers 22 and 26, respectively, are employed to provide adhesion between the antifuse material layer 20 and the lower and upper Ti barrier 20 and 28, respectively.

According to the present invention, the adhesion-promoting layers 22 and 26 should minimize the capacitance and do little to degrade the switching performance of the antifuse 10. The material for the adhesion-promoting layers 22 and 26 is preferably silicon carbide ($Si_xC_y$) where the ratio of x to y is 1.0+/−0.4. Depending on the ratio of x to y, the dielectric constant of the SiC layer will be the range of about 4 to about 6. The adhesion-promoting layers 22 and 26 should not substantially affect the electrical characteristics of antifuse 10 controlled by the antifuse material layer 24, such that the breakdown voltage, capacitance or leakage of the antifuse may not change by more than about ten percent, and are preferably quite thin.

As such, the adhesion-promoting layers 22 and 26 may be between one and a few atoms thick giving a thickness for the adhesion-promoting layers 22 and 26 a range of about 2 angstroms to about 20 angstroms. It should be appreciated that a layer having a thickness of 2 angstroms represents an average material layer thickness. For example, in a sparsely dense atomic monolayer there may be sufficient space between the individual atoms of the monolayer that a measured thickness will give an average thickness of the sparsely spaced atoms. The $Si_xC_y$ may be deposited using PECVD techniques that are well known to those of ordinary skill in the art In determining the capacitance of the antifuse 10, the capacitance of the structure, which includes adhesion-promoting layer 22, antifuse material layer 24, and adhesion-promoting layer 26, is the total series capacitance of layers 22, 24 and 26. A structure including a 2 angstrom layer of $Si_xC_y$, a 100 angstrom layer of amorphous carbon having a dielectric constant of about 2.5 to about 4, and a 2 angstrom layer of $Si_xC_y$, will have a dielectric constant of about 4, and a structure including a 20 angstrom layer of $Si_xC_y$, a 100 angstrom layer of amorphous carbon, and a 20 angstrom layer of $Si_xC_y$ will have a dielectric constant of about 5.5.

Silicon nitride ($Si_xN_y$) where the ratio of x to y is about 0.75+/−0.225 may also be employed as the adhesion-promoting layers 22 and 26 according to the present invention. The $Si_xN_y$ may be deposited using PECVD techniques well known to those of ordinary skill in the art. The dielectric constant of the $Si_xN_y$ layer will be in the range of about 6 to about 8, so that the dielectric constant for a tri-layer structure of $Si_xN_y$/amorphous carbon/$Si_xN_y$ with material layer thicknesses comparable to the material layer thicknesses of the tri-layer structure of $Si_xC_y$/amorphous carbon/$Si_xC_y$ described above will be higher than the dielectric constant for the $Si_xC_y$/amorphous carbon/$Si_xC_y$ tri-layer structure.

Silicon Carbide Nitride ($Si_xC_yN_z$) where the ratio of x to y to z is (1:1:1)+/−0.40 for any ratio may also be employed as the adhesion-promoting layers 22 and 26 according to the present invention. The SiCN may be deposited using PECVD techniques well known to those of ordinary skill in the art. The dielectric constant of the SiCN layer will be in the range of about 4 to about 8, so that the dielectric constant for a SiCN/amorphous carbon/SiCN structure with material layer thicknesses comparable to the material layer thicknesses of the SiC/amorphous carbon/$Si_xC_y$ structure described above will be higher than the dielectric constant for the $Si_xC_y$/amorphous carbon/$Si_xC_y$ structure.

The antifuse material layer 24 may be formed from amorphous carbon or amorphous carbon doped with hydrogen and/or fluorine. The thickness of antifuse material layer 24 has a range of about 50 angstroms to about 500 angstroms for a breakdown voltage of about 3V to about 20V. Preferably, the thickness of the antifuse material layer 24 is about 100 angstroms for breakdown of 5 volts. When the antifuse material layer 24 is formed from amorphous carbon doped with hydrogen, the hydrogen doping should be from about 1 atomic percent to about 40 atomic percent. The amorphous carbon, and combinations thereof, may be disposed by a source gas, preferably acetylene gas ($C_2H_2$).

Figure 2A:
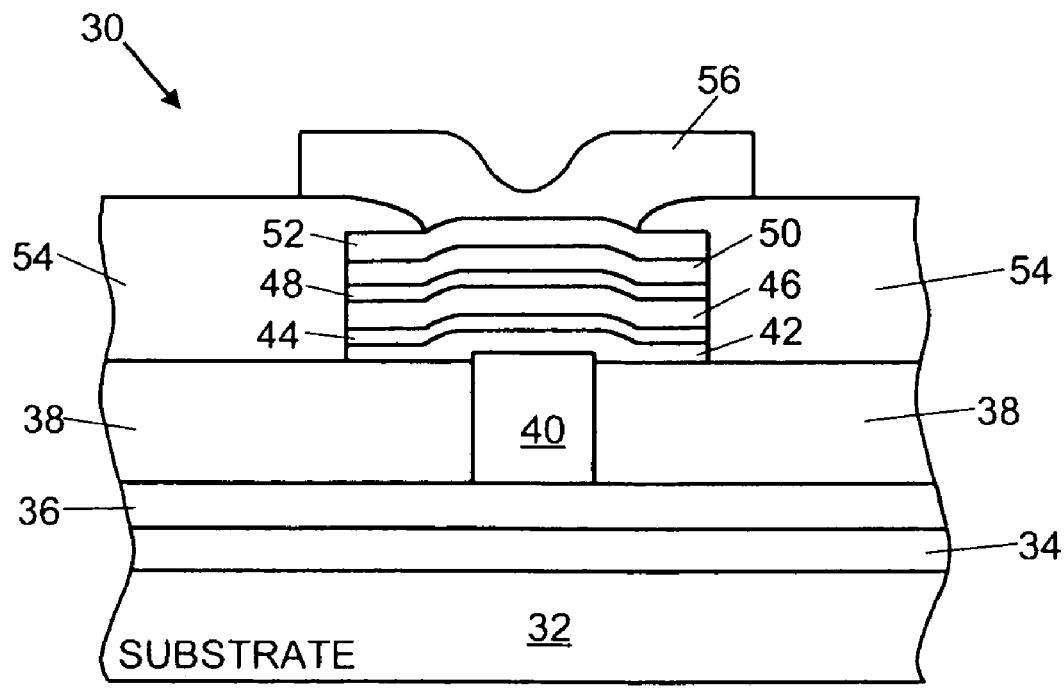
FIG. 2A illustrates in a cross-sectional view a first embodiment of a reprogrammable metal-to-metal antifuse structure employing the tri-layer thin adhesion layer/a-C/thin adhesion layer structure according to the present invention.
Figure 2B:
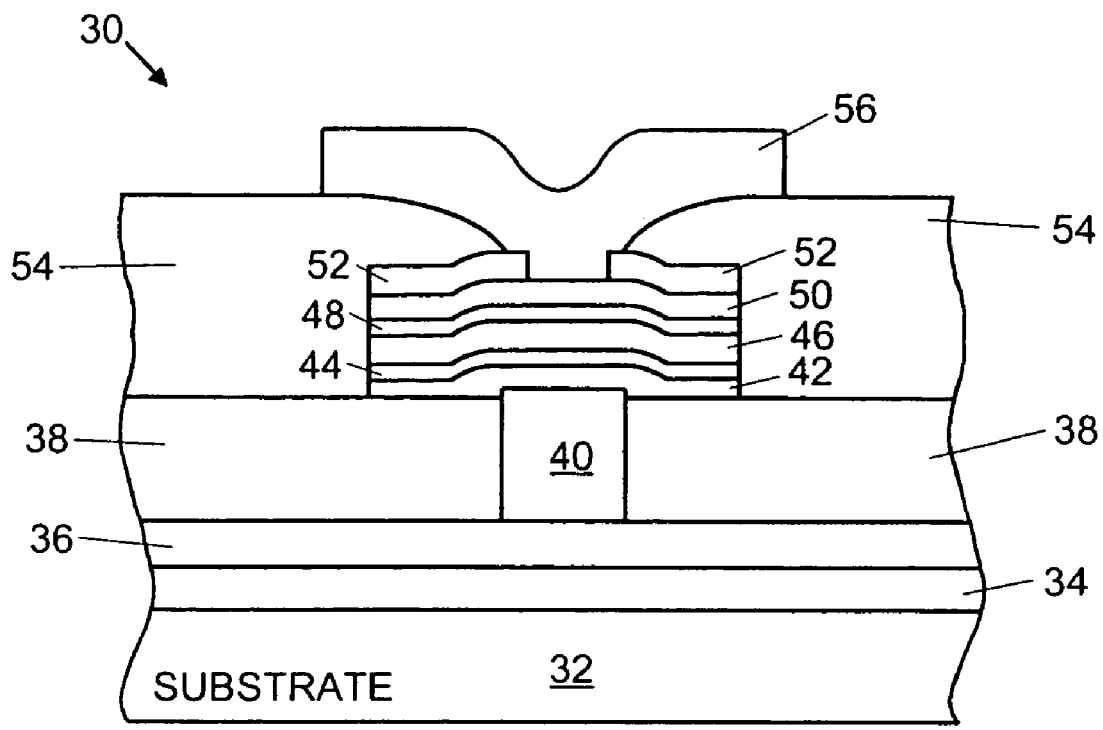
FIG. 2B illustrates in a cross-sectional view a second embodiment of a reprogrammable metal-to-metal antifuse structure employing the tri-layer thin adhesion layer/a-C/thin adhesion layer structure according to the present invention.

FIGS. 2A and 2B illustrates in cross-section a metal-plug embodiment of a reprogrammable metal-to-metal antifuse structure 30 according to the present invention. In the embodiment shown in FIGS. 2A and 2B, substrate 32 is covered by an insulating layer 34 and a metal interconnect layer 36. Persons of ordinary skill in the art will realize FIGS. 2A and 2B are merely illustrative and that metal interconnect layer 36 is not necessarily the first metal interconnect layer in a multi-level integrated circuit.

Insulating layer 38, formed from, for example, deposited silicon dioxide having a thickness from between about 400 nanometers (nm) to about 1000 nm, is disposed above metal interconnect layer 36 and includes a tungsten (W) plug 40 formed in a via therethrough and electrically coupled to metal interconnect layer 36. As is known in the art, the upper surfaces of insulating layer 38 and W plug 40 may be planarized to provide a relatively flat surface upon which to fabricate antifuse 30. Alternatively, W plug 40 may be raised above the surface of the surface of the insulating layer 38 as shown diagrammatically in FIGS. 2A and 2B by performing planarization using techniques such as chemical/mechanical polishing (CMP) or by performing a plasma oxide etch after planarization.

W plug 40 forms the lower electrode of antifuse 30. As depicted in FIGS. 2A and 2B, a Ti barrier metal layer 42 having a thickness of about 25 nm to about 200 nm is disposed over the W plug 40.

According to the present invention, a thin lower adhesion-promoting layer 44 formed from either $Si_xC_y$, $Si_xN_y$, or SiCN having a thickness of about 2 angstroms to about 20 angstroms, or other suitable adhesion-promoting layer, as described above, is disposed over the lower Ti barrier metal layer 42 lying on the tungsten plug 40. An antifuse material layer 46 of amorphous carbon or amorphous carbon doped with hydrogen and having a thickness of about 2.5 nm to about 1000 nm is disposed over the lower adhesion-promoting layer 44. A thin upper adhesion-promoting layer 48 formed from either $Si_xC_y$, $Si_xN_y$, SiCN having a thickness of about 2 angstroms to about 20 angstroms, or other suitable adhesion-promoting layer, as described above, is disposed over antifuse material layer 44.

A Ti barrier metal layer 50 forming an upper antifuse electrode having a thickness of about 25 nm to about 200 nm is disposed over the adhesion-promoting layer 48. A hard mask layer 52 is deposited over barrier metal layer 48. In FIG. 2B, the hardmask layer is formed form an insulating material such as silicon dioxide, and in FIG. 2A, the hardmask layer is formed from W.

In both FIGS. 2A and 2B, an insulating layer 54 of deposited silicon dioxide having a thickness of about 100 nm to about 200 nm is formed over the structure including lower adhesion-promoting layer 44, antifuse material layer 46, upper adhesion-promoting layer 48, and barrier metal layer 50. In FIG. 2B, metal interconnect layer 56 is disposed over the insulating layer 54 and contacts barrier metal layer 50 by a via formed through hardmask oxide layer 52 and insulating layer 54. In FIG. 2A, metal interconnect layer 56 is disposed over the insulating layer 54 and contacts the upper surface of W hardmask layer 52 by a via formed through insulating layer 54. As will be appreciated by persons of ordinary skill in the art, no etching step through hardmask layer 52 is necessary in the embodiment shown in FIG. 2A since the hardmask layer is formed from a conducting material.

The hardmask layer 52 is patterned and etched to form a hardmask that will act as an etch mask when etching barrier metal layer 50, upper adhesion-promoting layer 48, antifuse material layer 46, and lower adhesion-promoting layer 44 to form an antifuse "stack". Such a mask is used instead of a photoresist mask, since a subsequent photoresist-removal step would necessarily employ an etchant effective on organic materials. Such etchants would attack the exposed side edges of the carbon antifuse material layer 46.

When silicon dioxide is employed as hardmask layer 52, it protects the antifuse material layer 46 from being removed during a photoresist stripping step. Alternatively, Since Ti has high selectivity to W, a thin layer of PVD W in a range of about 25 nm to about 50 nm can also be employed as the hardmask layer 52 to etch the barrier metal layer 48. The oxide or W hardmask provides high etch selectivity and ability to etch metals without affecting the dielectric constant and the mechanical properties of the amorphous carbon antifuse material layer 44.

Figure 3A:
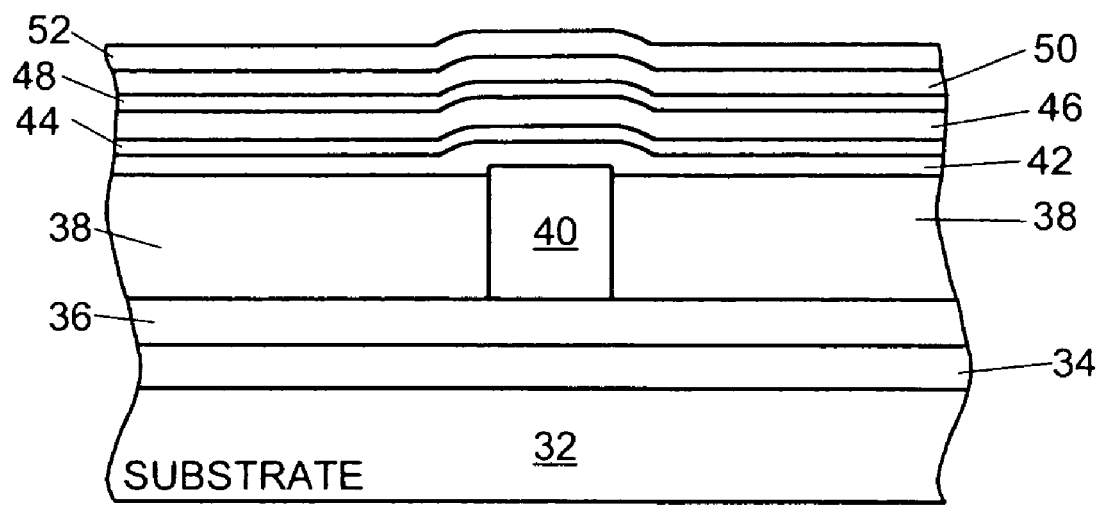
FIGS. 3A through 3E are cross-sectional views of the reprogrammable metal-to-metal antifuses of FIGS. 2A and 2B showing the structures existing at selected points in the fabrication process according to the present invention.

FIGS. 3A through 3E are cross-sectional views of the antifuses of FIGS. 2A and 2B showing the structure existing at selected points in the fabrication process. Since the fabrication of antifuse 30 begins after the well-known prior processing steps used to planarize insulating layer 38 and W plug 4, FIG. 3A shows the planarized insulating layer 38 and W plug 40 as the starting point for the fabrication process.

As may be seen from an examination of FIG. 3A, antifuse 30 of FIGS. 2A and 2B is fabricated by forming a lower Ti barrier layer 42 over the insulating layer 38 and the exposed top of W plug 40. Next, adhesion-promoting layer 44 is formed over Ti barrier layer 42. The adhesion-promoting layer 44 should be quite thin to minimize the effects on electrical characteristics of the antifuse material layer 46. As such, the adhesion-promoting layer 44 may be between one and a few atoms thick, i.e., in the range of between about 2 angstroms to about 20 angstroms. When either $Si_xC_y$, $Si_xN_y$, or $Si_xC_yN_z$ are employed as adhesion-promoting layer 44, either of the $Si_xC_y$, $Si_xN_y$, or $Si_xC_yN_z$ may be deposited using PECVD techniques well known to those of ordinary skill in the art.

Next, an antifuse material layer 46 formed from amorphous carbon or hydrogen-doped amorphous carbon is then deposited on adhesion-promoting layer 44 to a thickness in the range of between about 50 angstroms to about 500 angstroms using PECVD techniques well known to those of ordinary skill in the art. It will be appreciated by those of ordinary skill in the art that the thickness of the antifuse material layer employed will depend on the desired programming voltage for the finished antifuse 30.

Next, an upper adhesion-promoting layer 48 is deposited over amorphous carbon antifuse material layer 46. The adhesion-promoting layer 48 should be quite thin to minimize the effects on the electrical characteristics of the antifuse material layer 46. As such, the adhesion-promoting layer 48 may be between one and a few atoms thick, i.e., in the range of between about 2 angstroms to about 20 angstroms. When either $Si_xC_y$, $Si_xN_y$, SiCN are employed as adhesion-promoting layer 48, either the $Si_xC_y$, $Si_xN_y$, SiCN are deposited using PECVD techniques well known to those of ordinary skill in the art.

Next, Ti barrier layer 50 is deposited to a thickness of between about 25 nm to about 200 nm using PVD sputtering techniques well known to those of ordinary skill in the art. Hardmask layer 52 is then deposited over barrier metal layer 50. When the hardmask layer 52 is formed from an insulating material such as silicon dioxide, it may be deposited to a thickness between about 50 nm and about 400 nm, with about 200 nm preferred, using, for example, PECVD techniques well known to those of ordinary skill in the art. When the hardmask layer 52 is formed from W, it may be deposited to a thickness of between about 25 nm and about 50 nm using PVD sputtering techniques well known to those of ordinary skill in the art. FIG. 3A shows the structure resulting after these processing steps have been performed.

Figure 3B:
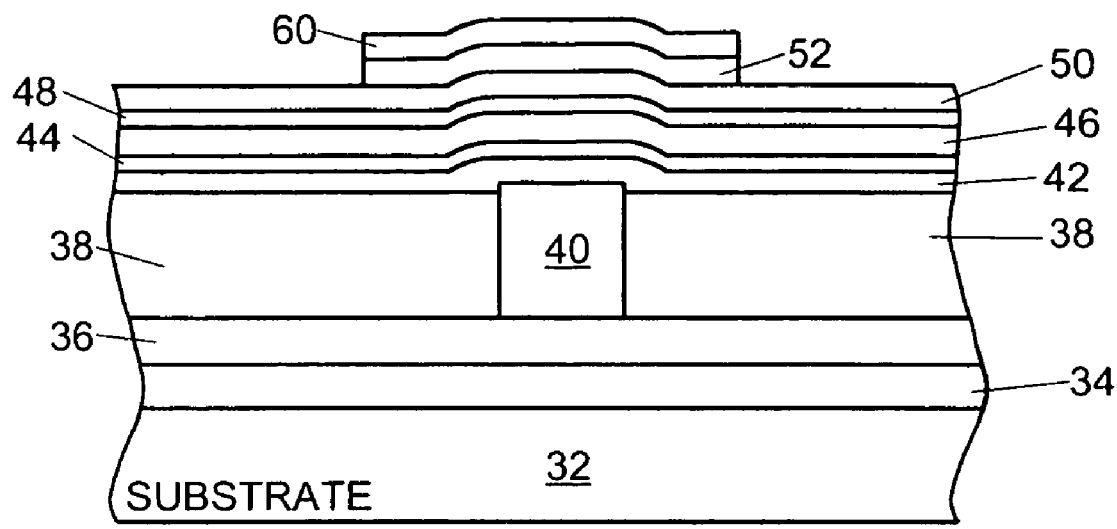

Referring now to FIG. 3B, a photoresist layer 60 is deposited and patterned on the hardmask layer 52, using conventional photolithography steps. Hardmask 52 is then etched using conventional processing techniques appropriate to its composition. FIG. 3B shows the structure resulting after these processing steps have been performed.

Figure 3C:
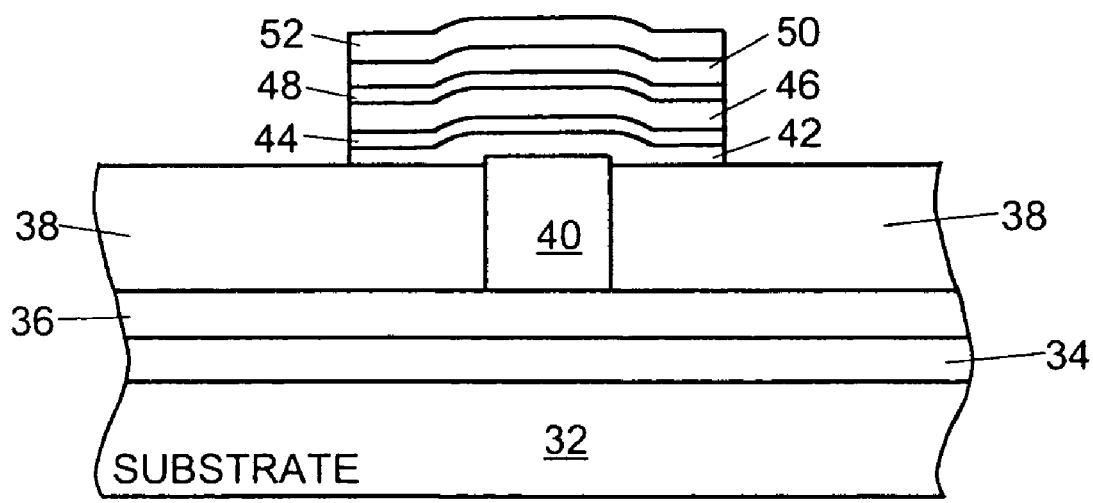

Referring now to FIG. 3C, the photoresist layer 60 is then stripped exposing the remaining patterned hardmask layer 52. The patterned hardmask layer 52 is left to act as an etch mask when etching lower Ti barrier layer 42, lower adhesion-promoting layer 44, antifuse material layer 46, upper adhesion-promoting layer 48, and upper Ti barrier layer 50 to form the antifuse stack. The antifuse stack is then etched using conventional processing techniques. FIG. 3C shows the structure resulting after these processing steps have been performed.

Figure 3D:
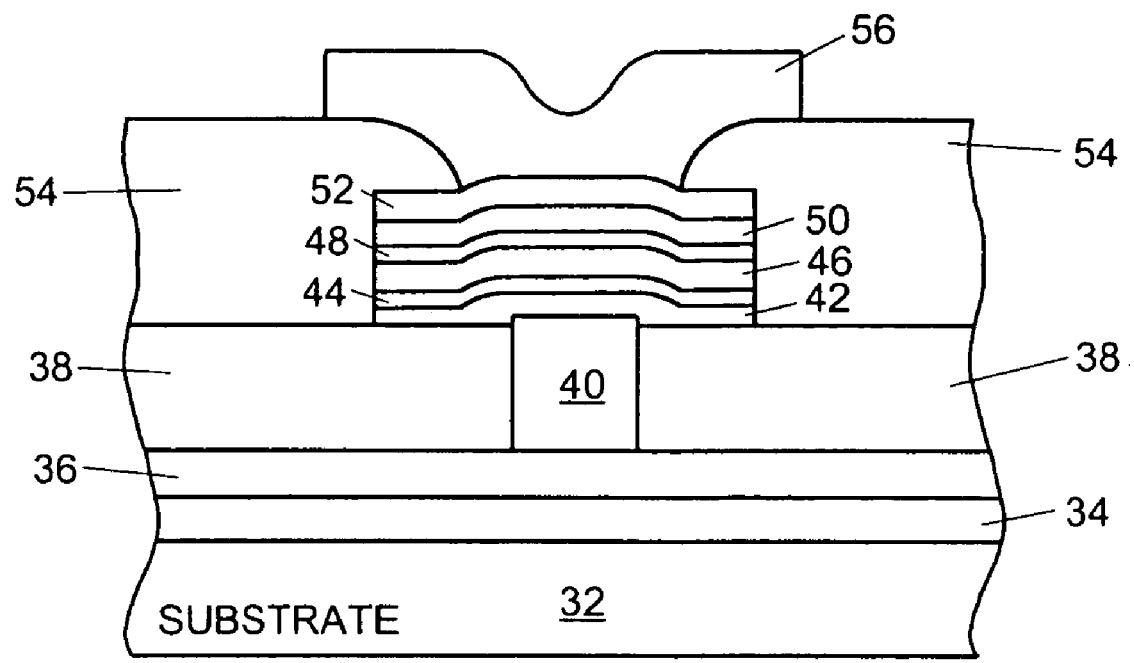
Figure 3E:
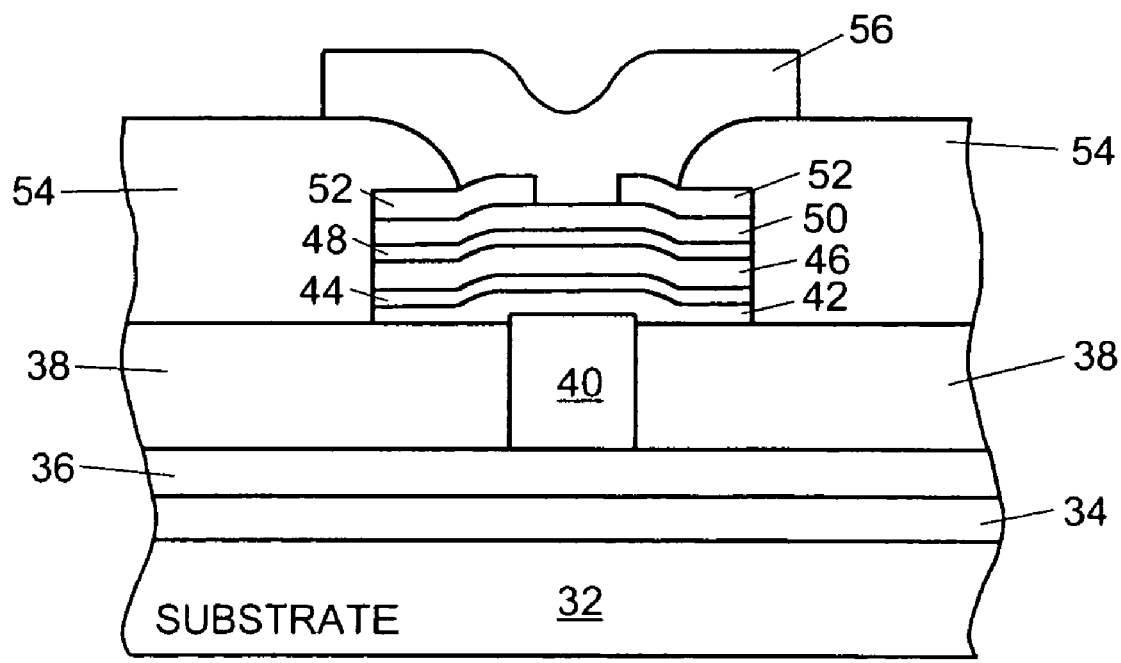

In FIGS. 3D and 3E, an insulating layer 54 of silicon dioxide having a thickness of about 100 nm to about 200 nm is deposited using, for example, PECVD techniques well known to those of ordinary skill in the art over the structure including lower adhesion-promoting layer 42, antifuse material layer 44, upper adhesion-promoting layer 46, barrier metal layer 48, and hardmask layer 50. In FIG. 3E, metal interconnect layer 56 is disposed over the insulating layer 54 and contacts barrier metal layer 50 by a via formed through hardmask oxide layer 52 and insulating layer 54. In FIG. 3D, metal interconnect layer 56 is disposed over the insulating layer 54 and contacts hardmask W layer 52 by a via formed through insulating layer 54. The metal interconnect layer 56 may be formed using PVD sputtering. The vias are formed in FIGS. 3E and 3F using conventional processing techniques.

The adhesion-promoting layers should minimize the capacitance of and do little to degrade the switching performance of the antifuse. The adhesion-promoting layers may be quite thin in a range of between about 2 angstroms and about 20 angstroms to minimize the effects on electrical characteristics of the antifuse material layer. The material for the adhesion-promoting layers is preferably silicon carbide ($Si_xC_y$). Depending on the ratio of x to y, the dielectric constant of the $Si_xC_y$ layer will be the range of between about 4 and about 6. Silicon nitride ($Si_xN_y$) may also be employed as the adhesion-promoting layers according to the present invention. Depending on the ratio of x to y, the dielectric constant of the $Si_xN_y$ layer will be the range of about 6 to about 8. Silicon Carbide Nitride ($Si_xC_yN_z$) where the ratio of x to y to z is about (1:1:1)+/−0.40 for any ratio may also be employed as the adhesion-promoting layers. The dielectric constant of the $Si_xC_yN_z$ layer will be in the range of between about 4 and about 8. The adhesion-promoting layers are deposited using PECVD techniques well known to those of ordinary skill in the art.

For an antifuse material layer of amorphous carbon having a dielectric constant of about 2.5 to about 4, a tri-layer structure including a 2 angstrom layer of $Si_xC_y$, a 100 angstrom layer of amorphous carbon, and a 2 angstrom layer of $Si_xC_y$, will have a dielectric constant of about 4, and a tri-layer structure including a 20 angstrom layer of $Si_xC_y$, a 100 angstrom layer of amorphous carbon, and a 20 angstrom layer of $Si_xC_y$, will have a dielectric constant of about 5.5. The dielectric constant for a tri-layer structure of $Si_xN_y$/amorphous carbon/$Si_xN_y$ with material layer thicknesses comparable to the material layer thicknesses of the tri-layer structure of $Si_xC_y$/amorphous carbon/$Si_xC_y$ will be higher than the dielectric constant for the $Si_xC_y$/amorphous carbon/$Si_xC_y$ tri-layer structure.

The antifuse according to the present invention is reprogrammable according to the method of the present invention. It may be programmed, and erased and reprogrammed. As is known in the art, antifuses are programmed by applying a programming potential across them until a sharp rise in current flow is sensed, indicating that a low-resistance connection has been established between the electrodes. As with prior-art antifuses, one or more "soak" cycles may be performed on the antifuse after programming as is known in the art.

The antifuse according to this invention can be programmed at low current of between 100 uA to 1 mA. The link formed at low current has low resistance (below 500 ohm). The subsequent soaking of the antifuse link, with a higher current up to 5 mA reduces the resistance further and tightens the programmed-resistance distribution.

The antifuse programmed at low current i.e. less than about 1 mA can be erased to the original off state condition (high resistance state) when subjected to a high current relative to the programming current i.e. about 10 mA to about 15 mA, a ratio of about 10:1 programming to erase current. Another case is when the link is formed with a programming current of less than about 1 mA and soaked with less than about 5 mA. This case will have a higher erase current i.e. about 15 mA to about 20 mA, a ratio of greater than about 3:1 soak to erase current.

The high ratio of switching current (erase current) to programming current indicates a reliable antifuse. The antifuse programmed and erased can be reprogrammed at voltages similar to the original programming voltages. In addition, the erased antifuse will have similar but somewhat higher leakage characteristics as compared to the original.

Figure 4:
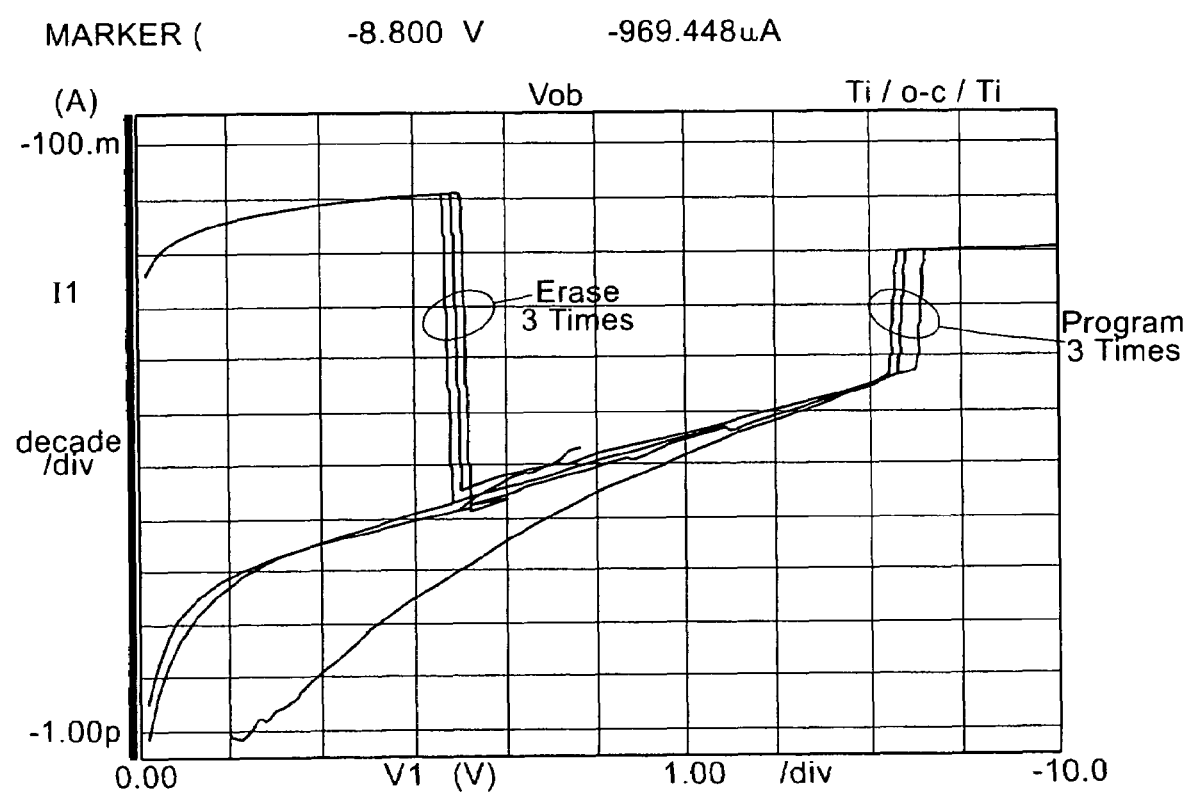
FIG. 4 is a set of IV curves showing three cycles of programming and erasing of an antifuse according to the present invention.

FIG. 4 is a set of IV curves showing three cycles of programming and erasing of an antifuse according to the present invention. The curves of FIG. 4 were plotted for an antifuse with an amorphous carbon antifuse layer as disclosed herein having a thickness of about 300 angstroms. As may be seen from an examination of FIG. 4, the antifuse programmed at voltages between about 8.2 to about 8.5 volts over the three programming cycles that were performed. Persons of ordinary skill in the art will appreciate that the programming voltage for an antifuse fabricated according to the present invention will be a function of the thickness of the amorphous carbon antifuse material layer.

After the antifuse is programmed, the circuit in which it is contained may be operated at voltages significantly below the programming voltage. For the antifuse having the program and erase characteristics shown in FIG. 4, the maximum operating voltage should be about 0.75-2.5v.

As also shown in FIG. 4, the antifuse of the present invention may be erased (returned to a high-resistance state) by placing a voltage potential across it. It has been found that the erase voltage is much lower than the programming voltage. In the case of the antifuse having the characteristics shown in FIG. 4, the erase potential has been found to be between about 3.4 to about 3.6 volts and the erase current less than about 20 mA over the three programming cycles that were performed. With the absence of a resistor at probe tip (normal routine) the erase voltage will be less than about 1v. The explanation of the applied voltage is: the voltage is dependent on the circuit resistance, where the voltage is supplied to apply the erase current necessary to erase the antifuse. The example shown has a 250 ohm resistor at the probe tip of the device under test, this resistor is for preventing current dumping which may occur from the test setup equipment. Thus the applied voltage shown in this example is an artifact of the resistor in series, and not the critical parameter. The applied current is the critical parameter.

Figure 5:
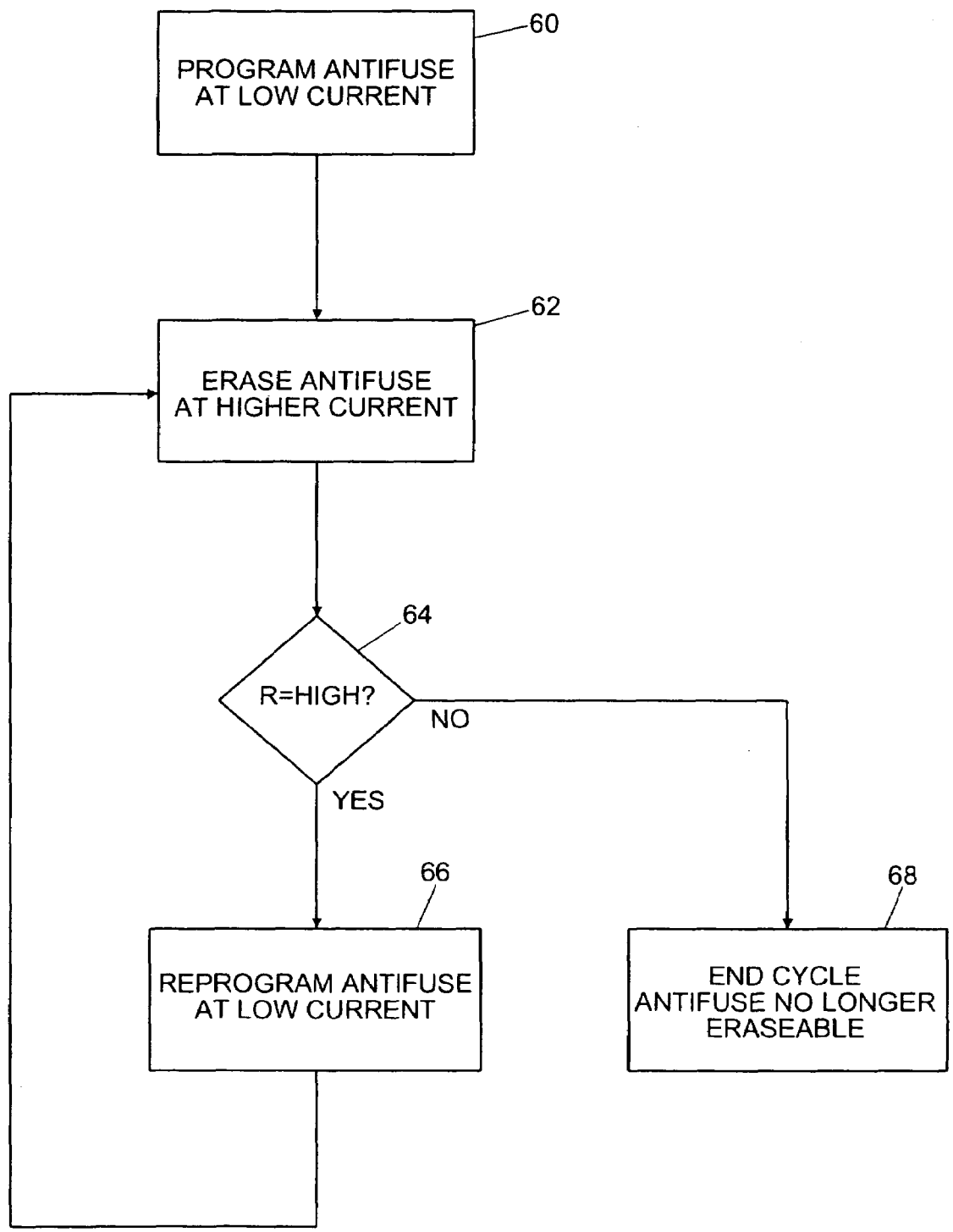
FIG. 5 is a block diagram illustrating a typical program/erase cycle that can be used with the reprogrammable antifuse of the present invention.

Referring now to FIG. 5, a block diagram illustrates a typical program/erase cycle that can be used with the reprogrammable antifuse of the present invention. First, as shown at reference numeral 60, the antifuse is subjected to a programming cycle as disclosed herein. Next, at reference numeral 62, the antifuse may be subjected to an erase cycle as disclosed herein. Because the reprogrammable antifuse of the present invention may not be reprogrammed an infinite number of times, the antifuse may then be checked at reference numeral 64 to see if the erase cycle has been successful, i.e., whether the antifuse has been returned to a high-resistance state. If the antifuse has been successfully returned to a high-resistance state, it may again be programmed as shown at reference numeral 66. If the antifuse has not been successfully returned to a high-resistance state, this indicates that it may not be erased and thus cannot again be programmed as shown at reference numeral 68. As will be appreciated by persons of ordinary skill in the art, the processes of reference numerals 60 through 68 may, but need not be, performed at times proximate to one another.

While the invention has been described with reference to an exemplary embodiment, it will be understood by those skilled in the art that various changes may be made and equivalents may be substituted for elements thereof without departing from the scope of the invention. For example, it is to be understood that oxygen may be included in the mixture of any materials disclosed for the adhesion-promoting layers, for example, in addition to $Si_xC_y$ and $Si_xN_y$; $Si_xO_yC_z$ and $Si_xO_yN_z$ may be used, as well as similar mixtures of the other materials disclosed. In addition, many modifications may be made to adapt a particular situation or material to the teachings without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for fabricating a reprogrammable metal-to-metal antifuse, comprising:

planarizing an insulating layer and a tungsten plug;

forming a lower Ti barrier layer over said insulating layer and said tungsten plug;

forming a lower adhesion-promoting layer over said lower Ti barrier layer, said lower adhesion-promoting layer selected from the group comprising $Si_xC_y$ and $Si_xN_y$;

forming an antifuse material layer over said lower adhesion-promoting layer, wherein said antifuse material layer is selected from the group comprising amorphous carbon, amorphous carbon doped with at least one of hydrogen and fluorine, and amorphous silicon carbide;

forming an upper adhesion-promoting layer over said antifuse material layer, said upper adhesion-promoting layer selected from the group comprising $Si_xC_y$ and $Si_xN_y$;

forming an upper Ti barrier metal layer over said antifuse material layer;

forming an oxide or tungsten hardmask layer over said barrier metal layer;

forming a layer of photoresist over said hardmask layer;

defining said hardmask layer;

removing said photoresist;

defining a shape of a stack for said antifuse by etching said upper Ti barrier layer, said upper adhesion-promoting layer, said antifuse material layer, said lower adhesion-promoting layer, and said lower Ti barrier metal layer using said hardmask layer as a mask;

forming an insulating layer over said stack;

forming an aperture in said insulating layer;

forming a metal interconnect layer over said insulating layer and in said aperture;

forming a second masking layer over said metal interconnect layer; and defining said metal interconnect layer.

2. The method of claim 1, wherein said forming said antifuse material layer comprises forming said antifuse material layer to a thickness of from about 10 nm to about 80 nm.

3. The method of claim 1, wherein said forming said Ti barrier metal layer comprises forming said Ti barrier metal layer to a thickness of from about 25 nm to about 200 nm.

4. The method of claim 1, wherein said lower and upper adhesion-promoting layers are essentially monolayers.

5. The method of claim 1, wherein said forming an antifuse material layer comprises depositing said antifuse layer from an acetylene source gas.

* * * * *